US010079175B2

(12) United States Patent
Farooq et al.

(10) Patent No.: US 10,079,175 B2
(45) Date of Patent: Sep. 18, 2018

(54) INSULATING A VIA IN A SEMICONDUCTOR SUBSTRATE

(71) Applicant: International Business Machines Corporation, Armonk, NY (US)

(72) Inventors: Mukta G. Farooq, Hopewell Junction, NY (US); Jennifer A. Oakley, Poughkeepsie, NY (US); Kevin S. Petrarca, Newburgh, NY (US); Nicole R. Reardon, Fishkill, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 15/601,488

(22) Filed: May 22, 2017

(65) Prior Publication Data
US 2017/0256447 A1    Sep. 7, 2017

Related U.S. Application Data

(62) Division of application No. 14/749,788, filed on Jun. 25, 2015, now Pat. No. 9,728,450.

(51) Int. Cl.
| | | |
|---|---|---|
| *H01L 29/00* | (2006.01) | |
| *H01L 21/768* | (2006.01) | |
| *H01L 49/02* | (2006.01) | |
| *H01L 23/48* | (2006.01) | |
| *H01L 23/532* | (2006.01) | |

(52) U.S. Cl.
CPC .. *H01L 21/76856* (2013.01); *H01L 21/76831* (2013.01); *H01L 21/76846* (2013.01); *H01L 21/76877* (2013.01); *H01L 23/481* (2013.01); *H01L 23/53238* (2013.01); *H01L 28/40* (2013.01)

(58) Field of Classification Search
CPC ............. H01L 23/53238; H01L 23/481; H01L 21/76877; H01L 21/76831; H01L 21/76846; H01L 21/76856; H01L 28/40
USPC .................................................. 257/532, 774
See application file for complete search history.

(56) References Cited

U.S. PATENT DOCUMENTS

| | | |
|---|---|---|
| 5,271,972 A | 12/1993 | Kwok et al. |
| 5,356,722 A | 10/1994 | Nguyen et al. |
| 6,149,974 A | 11/2000 | Nguyen et al. |
| 7,772,081 B2 | 8/2010 | Lin et al. |
| 7,943,473 B2 | 5/2011 | Ellul et al. |
| 8,067,816 B2 | 11/2011 | Kim et al. |
| 8,124,452 B2 | 2/2012 | Sheats |
| 8,193,632 B2 | 6/2012 | Chang et al. |

(Continued)

OTHER PUBLICATIONS

Lisker et al., *Sub-Atmospheric Chemical Vapor Deposition of SiO2 for Dielectric Layers in High Aspect Ratio TSVs*, The Electrochemical Society (ECS) Transactions, May 2011, vol. 35, Issue 2, pp. 95-104, The Electrochemical Society, Pennington, NJ, DOI: 10.1149/1.3568851.

(Continued)

*Primary Examiner* — Thien F Tran
(74) *Attorney, Agent, or Firm* — Steven Meyers; Joseph D. Downing; Kennedy Lenart Spraggins LLP

(57) ABSTRACT

Insulating a via in a semiconductor substrate, including: depositing, in the via, a dielectric layer; depositing, in the via, a barrier layer; allowing the barrier layer to oxidize; and depositing, in the via, a conducting layer.

10 Claims, 7 Drawing Sheets

(56) References Cited

U.S. PATENT DOCUMENTS

| | | |
|---|---|---|
| 8,324,066 B2 | 12/2012 | Kim et al. |
| 8,350,358 B2 | 1/2013 | Kim et al. |
| 8,362,599 B2 | 1/2013 | Kim et al. |
| 8,391,018 B2 | 3/2013 | Chandrasekaran et al. |
| 8,404,583 B2 | 3/2013 | Hua et al. |
| 8,405,203 B2 | 3/2013 | Kearney et al. |
| 8,451,581 B2 | 5/2013 | Chandrasekaran et al. |
| 8,563,095 B2 | 10/2013 | Rajagopalan et al. |
| 8,618,640 B2 | 12/2013 | Lu et al. |
| 8,623,707 B2 | 1/2014 | Kearney et al. |
| 9,728,450 B2 | 8/2017 | Farooq et al. |
| 2004/0053446 A1* | 3/2004 | Matsubara ........ H01L 21/76843 438/118 |
| 2013/0056360 A1 | 3/2013 | Lu et al. |
| 2014/0175652 A1 | 6/2014 | Yu et al. |
| 2014/0312412 A1 | 10/2014 | Guo et al. |
| 2015/0137387 A1 | 5/2015 | Choi et al. |
| 2016/0379876 A1 | 12/2016 | Farooq et al. |

OTHER PUBLICATIONS

Appendix P; List of IBM Patent or Applications Treated as Related, Aug. 15, 2017, 2 pages.

* cited by examiner

INSULATING A VIA IN A SEMICONDUCTOR SUBSTRATE

CROSS REFERENCE TO RELATED APPLICATION

This application is a divisional application of U.S. application Ser. No. 14/749,788, filed Jun. 25, 2015.

BACKGROUND

The present disclosure is generally related to data processing, or, more specifically, methods, apparatus, and products for insulating a via in a semiconductor substrate.

Description Of Related Art

Modern integrated circuits ('ICs') can be built, in part, using semiconductor substrates that have vias drilled into the semiconductor substrates. In spite of the fact that such vias may be filled with dielectric and metallic liners, the vias are vulnerable to insulator field breakdown under high voltage applications.

SUMMARY

Methods, apparatuses, and products for insulating a via in a semiconductor substrate, including: depositing, in the via, a dielectric layer; depositing, in the via, a barrier layer; allowing the barrier layer to oxidize; and depositing, in the via, a conducting layer.

The foregoing and other objects, features and advantages described herein will be apparent from the following more particular descriptions of example embodiments as illustrated in the accompanying drawings wherein like reference numbers generally represent like parts of example embodiments.

DETAILED DESCRIPTION OF EXAMPLE EMBODIMENTS

Figure 1:
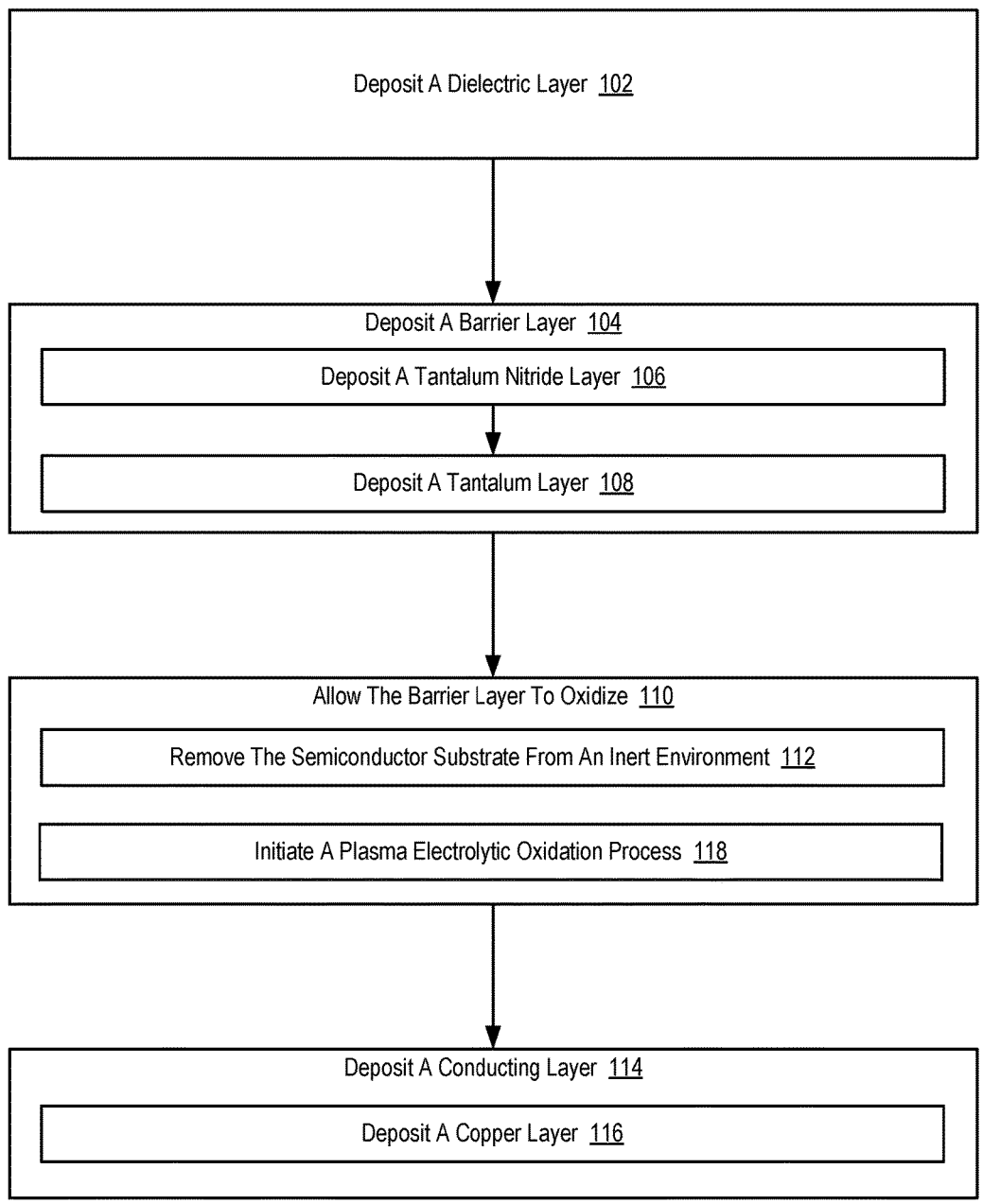
FIG. 1 sets forth a flow chart illustrating an example method for insulating a via in a semiconductor substrate according to embodiments of the present disclosure.

Example methods, apparatus, and products for insulating a via in a semiconductor substrate in accordance with embodiments of the present disclosure are described with reference to the accompanying drawings, beginning with FIG. 1. FIG. 1 sets forth a flow chart illustrating an example method for insulating a via in a semiconductor substrate according to embodiments of the present disclosure. A semiconductor substrate may be embodied, for example, as a silicon wafer or other substrate used in electronics for the fabrication of integrated circuits. The via may be embodied as a vertical electrical connection passing completely through semiconductor substrate such as, for example, a through-silicon via ('TSV').

The example method depicted in FIG. 1 includes depositing (102), in the via, a dielectric layer. In the example method depicted in FIG. 1, depositing (102) the dielectric layer may be carried out, for example, through the use of a chemical vapor deposition ('CVD') process that results in the creation of a CVD oxide or CVD nitride film. CVD is a chemical process used to produce solid materials. CVD can be used, for example, in the semiconductor industry to produce thin films by exposing the semiconductor substrate to one or more volatile precursors. The one or more volatile precursors can react and/or decompose on the surface of the semiconductor substrate to produce a desired deposit, referred to above as a film. The dielectric layer may be used as an insulator and chemical barrier in manufacturing ICs. Alternately, a physical vapor deposition ('PVD') process may also be used that results in the creation of a PVD dielectric film.

Figure 2:
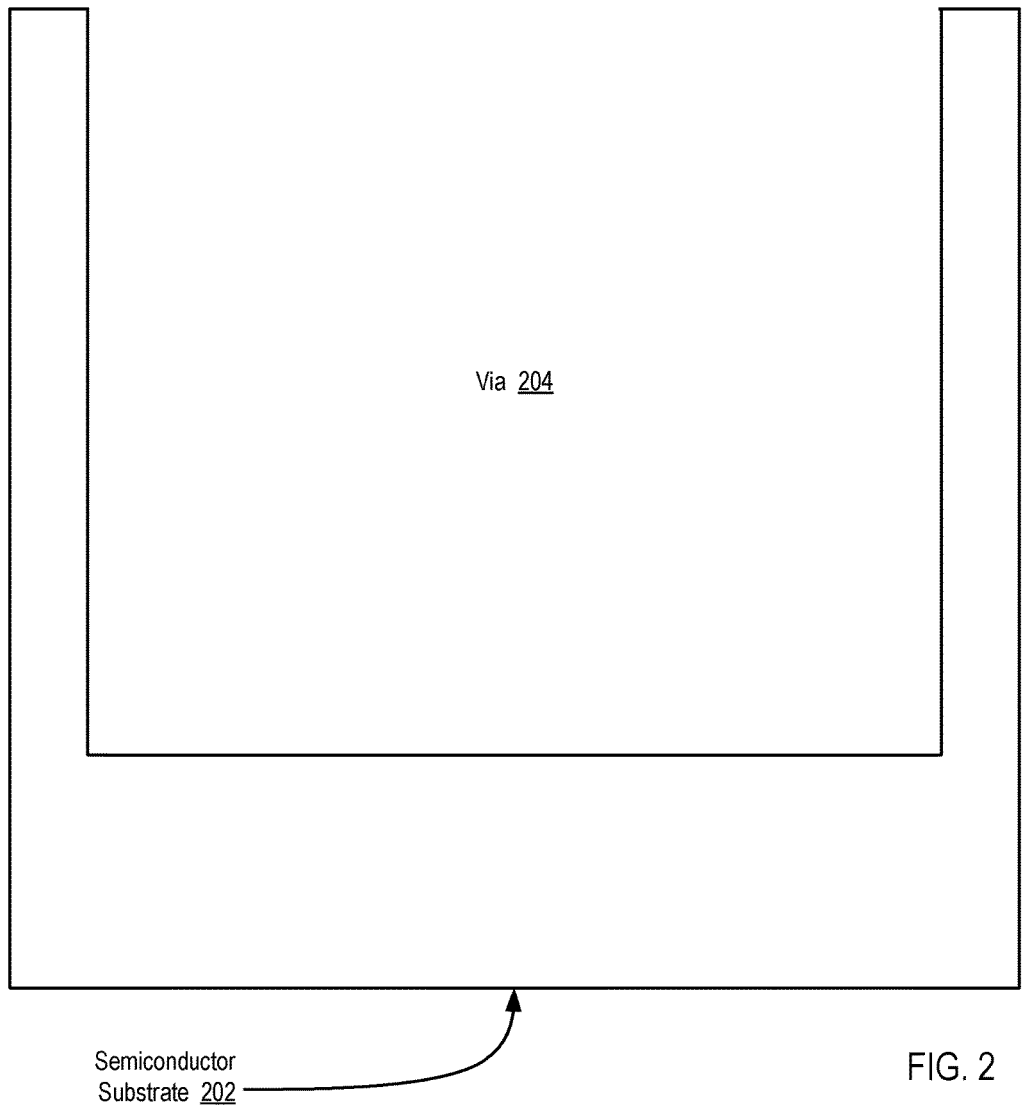
FIG. 2 sets forth an illustration of a semiconductor substrate according to embodiments of the present disclosure.
Figure 3:
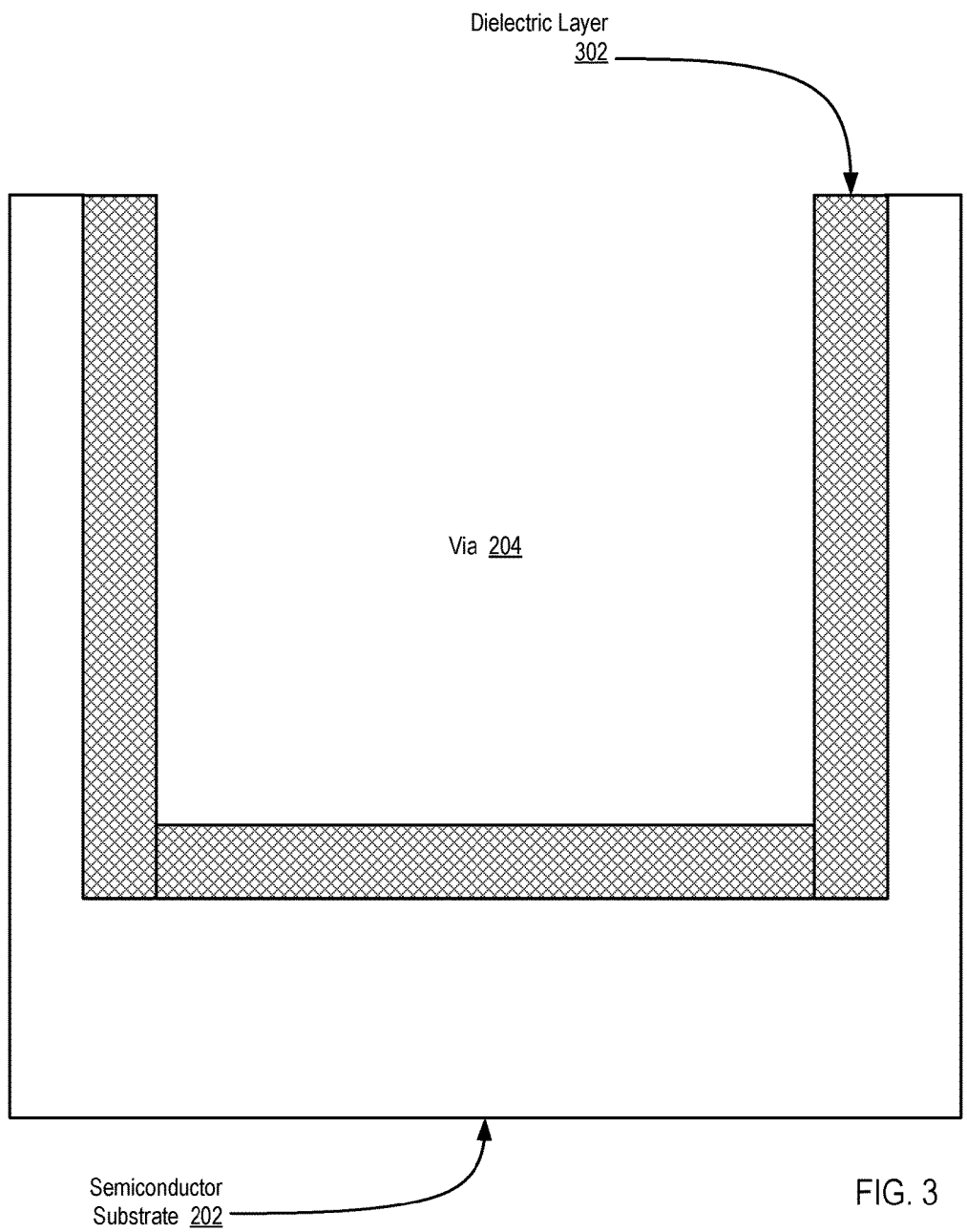
FIG. 3 sets forth an illustration of a semiconductor substrate according to embodiments of the present disclosure.

For additional illustration, FIG. 2 sets forth an illustration of a semiconductor substrate (202) according to embodiments of the present disclosure. The semiconductor substrate (202) of FIG. 2 includes a via (204). FIG. 3 sets forth an illustration of a semiconductor substrate (202) that also includes a via (204) according to embodiments of the present disclosure. In the example depicted in FIG. 3, however, a dielectric layer (302) has been deposited (102) in the via (204).

Referring again to the example depicted in FIG. 1, the example method depicted in FIG. 1 also includes depositing (104), in the via, a barrier layer. The barrier layer represents a metallic liner that is used to separate other conductive materials that are subsequently layered on the metallic liner from the dielectric layer deposited (102) above. In the example method depicted in FIG. 1, depositing (104) a barrier layer may be carried out, for example, by first depositing (106) a tantalum nitride layer and subsequently depositing (108) a tantalum layer. Depositing (106) the tantalum nitride layer may be carried out, for example, through the use of PVD or CVD processes, as well as atomic layer deposition ('ALD') processes that result in the growth of a tantalum nitride film. Depositing (108) a tantalum layer may be carried out through the use of similar processes using PVD, ALD or CVD, thereby resulting in the growth of a tantalum film. In an alternative embodiment, depositing (104) a barrier layer may be carried out by first depositing a titanium nitride layer and subsequently depositing a titanium layer.

The barrier layer is useful as the barrier metal layer must completely surround all copper interconnections, since diffusion of copper into surrounding materials would degrade the properties of the surrounding materials. For example, a barrier metal must limit copper diffusivity sufficiently to chemically isolate the copper conductor from the silicon below and the silicon surrounding it (e.g., the semiconductor substrate) yet have high electrical conductivity in order to maintain a good electronic contact.

Figure 4:
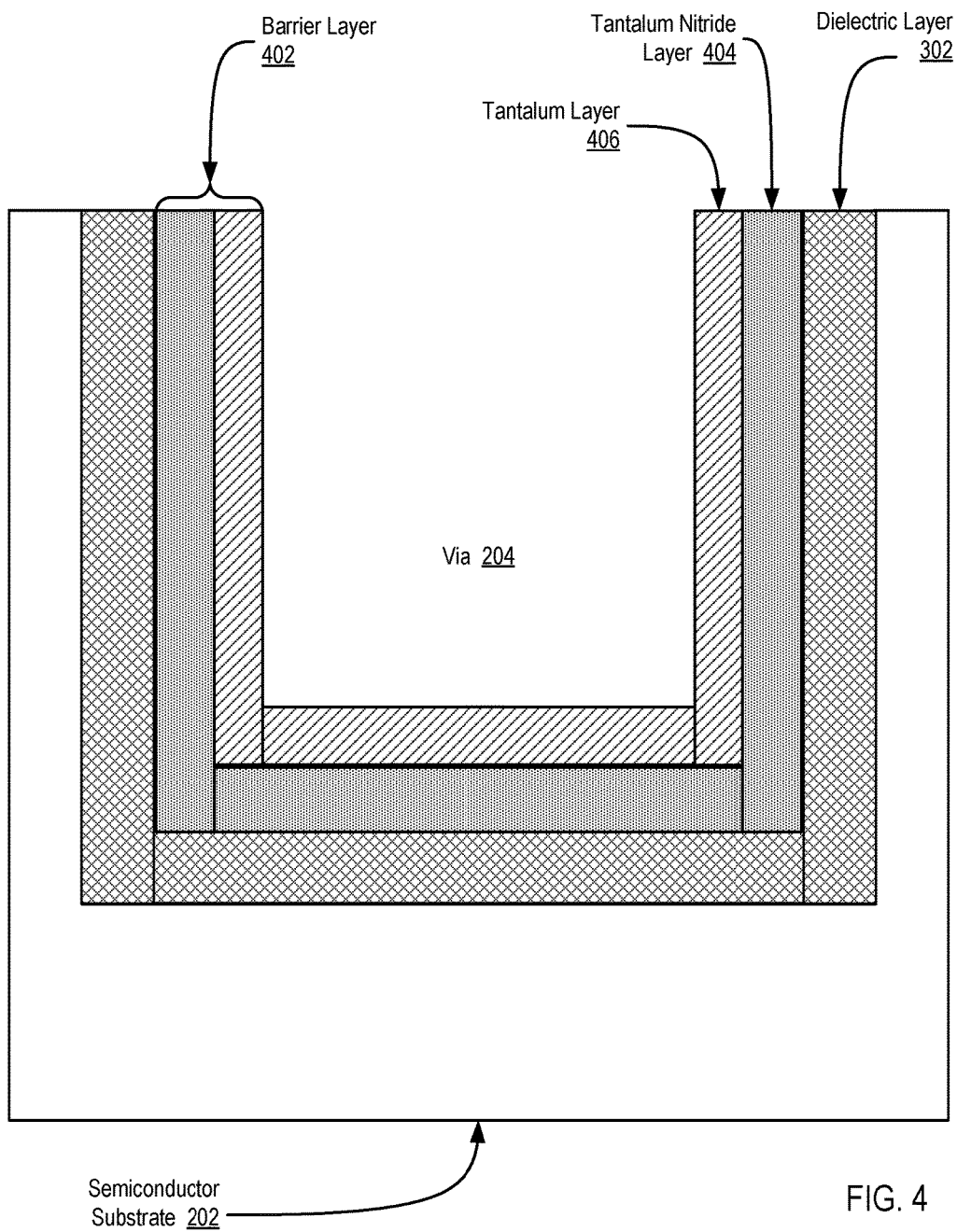
FIG. 4 sets forth an illustration of a semiconductor substrate according to embodiments of the present disclosure.

For additional illustration, FIG. 4 sets forth an illustration of a semiconductor substrate (202) that also includes a via (204) according to embodiments of the present disclosure. In the example depicted in FIG. 4, a dielectric layer (302) has been deposited (102) in the via (204) and a barrier layer (402) has also been deposited (104) in the via (204). The barrier layer (402) depicted in FIG. 4 is comprised of a tantalum nitride layer (404) as well as a subsequently applied tantalum layer (406).

Referring again to the example depicted in FIG. 1, the example method depicted in FIG. 1 also includes allowing (110) the barrier layer to oxidize. In the example method depicted in FIG. 1, allowing (110) the barrier layer to oxidize can include removing (112) the semiconductor substrate from an inert environment. In the example method depicted in FIG. 1, allowing (110) the barrier layer to oxidize can alternatively include initiating (118) a plasma electrolytic oxidation ('PEO') process. The PEO process is an electrochemical surface treatment process for generating oxide coatings on metals. By allowing (110) the barrier layer to oxidize, a layer of tantalum pentoxide or other tantalum oxide is formed. Readers will appreciate that because tantalum pentoxide has a relatively high dielectric constant, the formation of such a layer adds another dielectric layer to the via structure.

Figure 5:
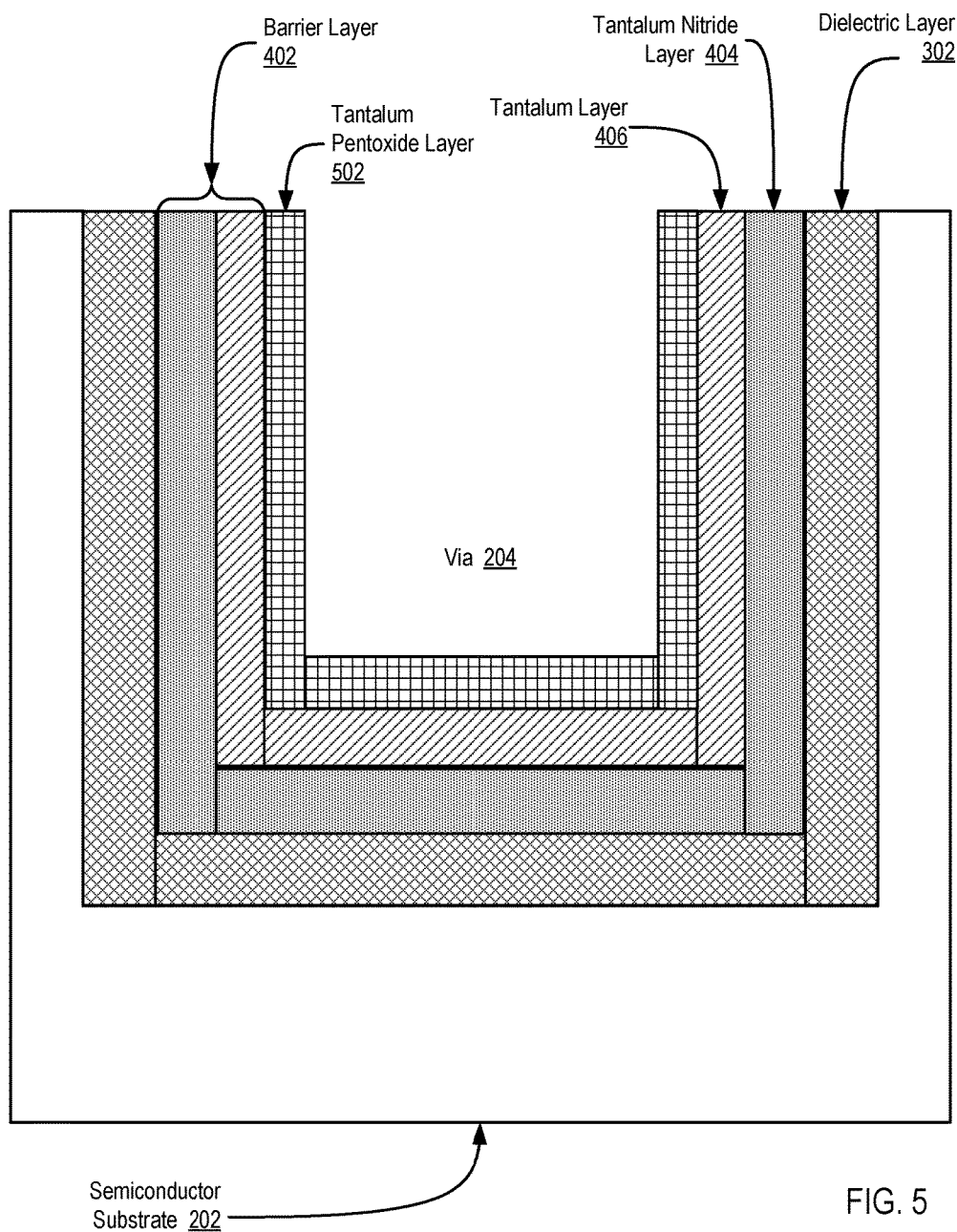
FIG. 5 sets forth an illustration of a semiconductor substrate according to embodiments of the present disclosure.

For additional illustration, FIG. 5 sets forth an illustration of a semiconductor substrate (202) that also includes a via (204) according to embodiments of the present disclosure. In the example depicted in FIG. 5, a dielectric layer (302) has been deposited (102) in the via (204) and a barrier layer (402) has also been deposited (104) in the via (204). The barrier layer (402) depicted in FIG. 5 is comprised of a tantalum nitride layer (404) as well as a subsequently applied tantalum layer (406), which has been allowed (110) to oxidize, thereby creating a tantalum pentoxide layer (502).

Referring again to the example depicted in FIG. 1, the example method depicted in FIG. 1 also includes depositing (112), in the via, a conducting layer. In the example method depicted in FIG. 1, depositing (112) a conducting layer can include depositing (114) a copper layer.

Figure 6:
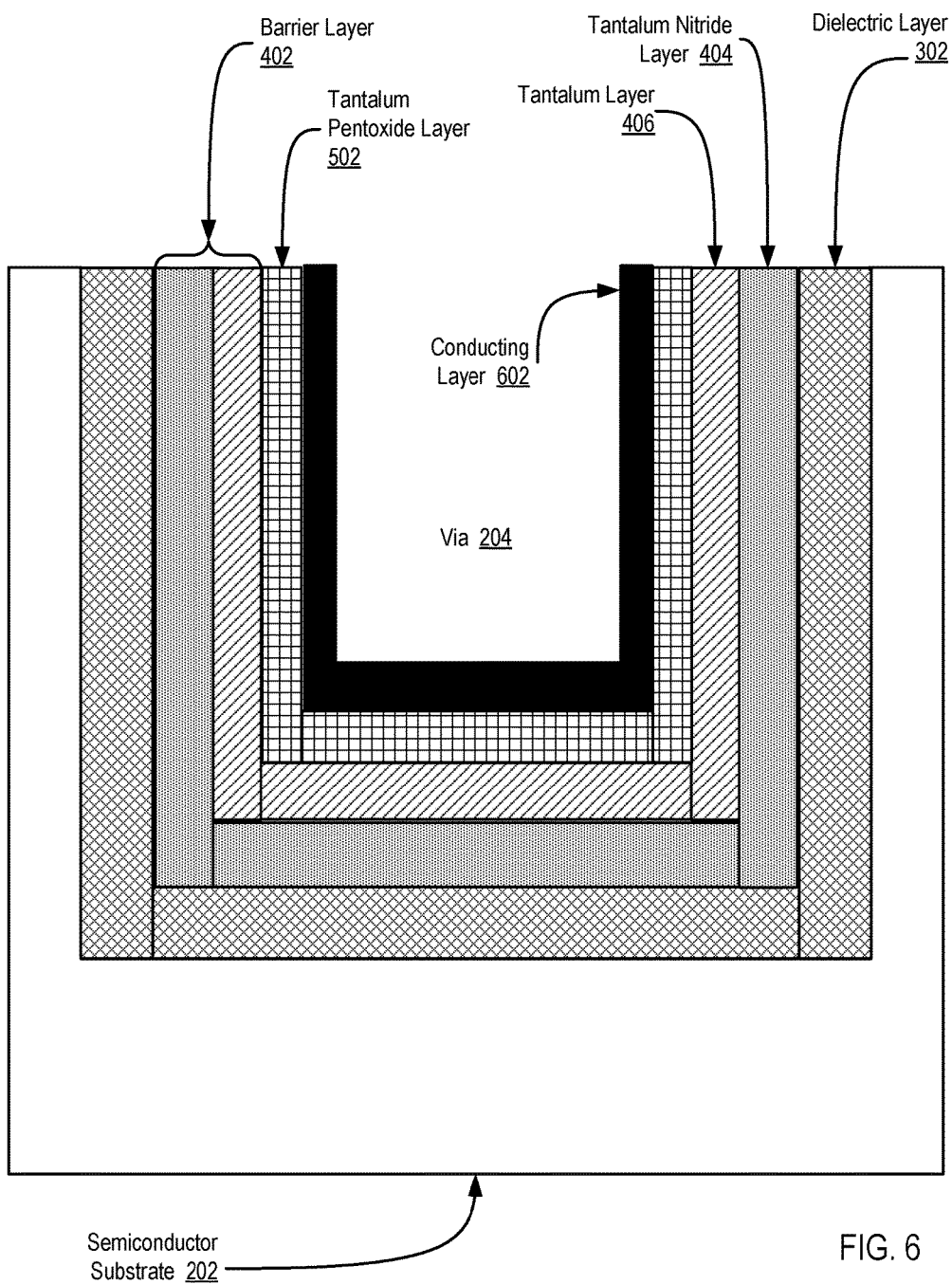
FIG. 6 sets forth an illustration of a semiconductor substrate according to embodiments of the present disclosure.

For additional illustration, FIG. 6 sets forth an illustration of a semiconductor substrate (202) that also includes a via (204) according to embodiments of the present disclosure. In the example depicted in FIG. 6, a dielectric layer (302) has been deposited (102) in the via (204) and a barrier layer (402) has also been deposited (104) in the via (204). The barrier layer (402) depicted in FIG. 6 is comprised of a tantalum nitride layer (404) as well as a subsequently applied tantalum layer (406), which has been allowed (110) to oxidize, thereby creating a tantalum pentoxide layer (502). The example depicted in FIG. 6 also includes a conducting layer (602) that has been deposited (112) in the via (204). The conducting layer (602) can be embodied as tantalum, cobalt, titanium, titanium nitride, ruthenium, and so on, that will enable complete filling of the via with a conducting metal such as copper, tungsten, aluminum, cobalt, or other appropriate conducting metal.

Such a structure as described above may be used to enable a TSV in a semiconductor substrate. Further, this TSV may subsequently be exposed from the backside of the semiconductor substrate by a combination of grinding, polishing, wet chemical or dry reactive ion etch processes. Such an exposed TSV may then be connected to another semiconductor substrate or a packaging substrate. The top side of the semiconductor substrate may further be attached to another silicon or other semiconductor substrate. In this way, the TSV provides electrical connectivity between the substrates on both sides of the TSV. The TSV built with the above preferred embodiment is robust and has the ability to withstand high voltage applications. Further, such a TSV may also be used for its capacitor structure, which is enabled by sandwiching a dielectric layer such as tantalum oxide or specifically tantalum pentoxide layer between two conducting layers.

Figure 7:
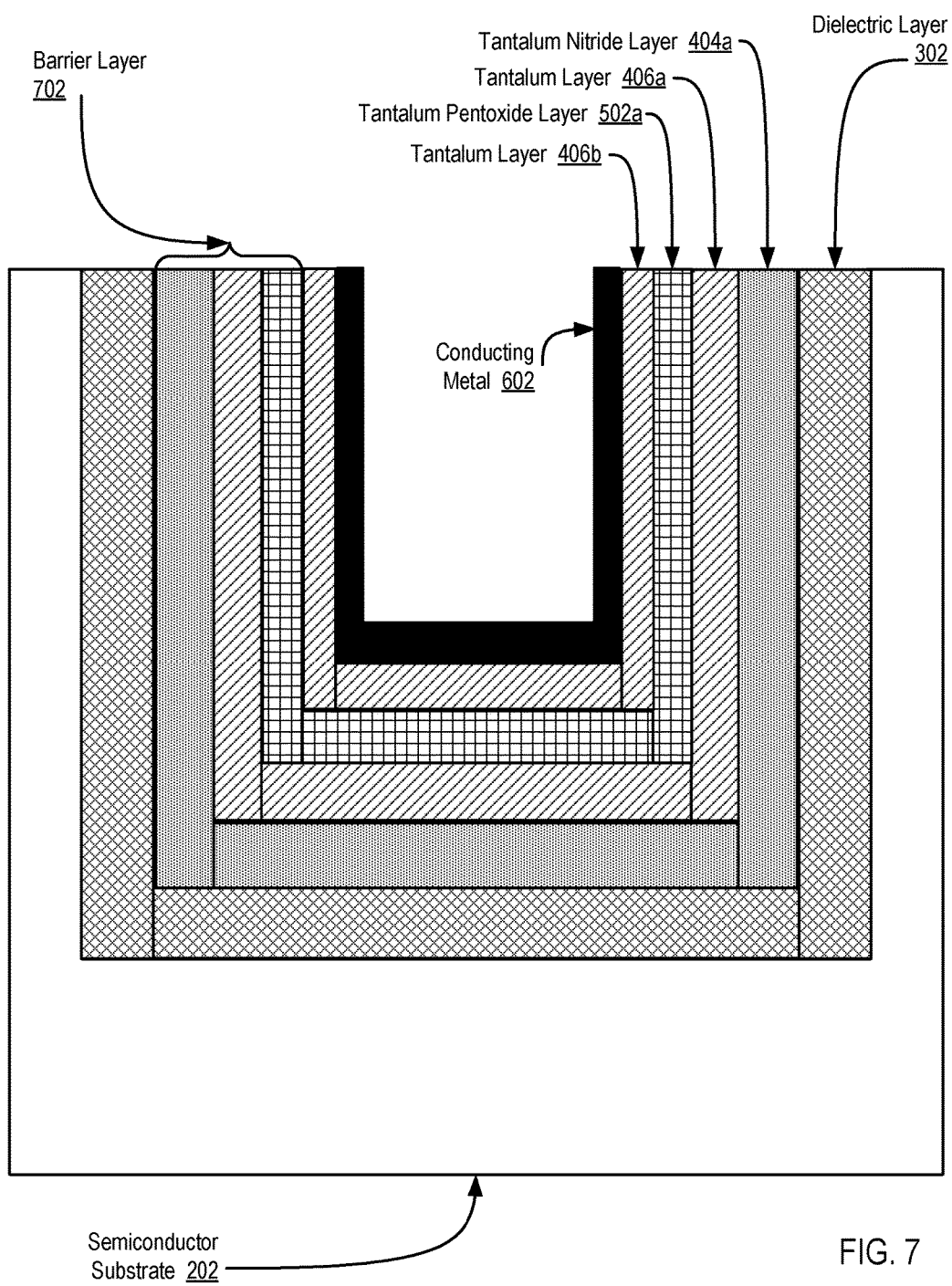
FIG. 7 sets forth an illustration of a semiconductor substrate according to embodiments of the present disclosure.

For further explanation, FIG. 7 sets forth an illustration of a semiconductor substrate (202) according to embodiments of the present disclosure. The semiconductor substrate (202) of FIG. 7 can include a dielectric layer (302) deposited on the semiconductor substrate (202). The dielectric layer (302) may be embodied, for example, as a CVD oxide or CVD nitride film, as a PVD dielectric film, and so on.

The semiconductor substrate (202) also includes a capacitor structure. The capacitor structure includes a barrier layer (702) deposited on the dielectric layer (302). In the example depicted in FIG. 7, the barrier layer (702) includes a tantalum nitride layer (404a) and an oxidized tantalum layer (406a) deposited on the tantalum nitride layer (404a). The barrier layer (702) of FIG. 7 is 'partially oxidized' as one portion of the barrier layer (702), the tantalum nitride layer (404a), is not oxidized while another portion of the barrier layer (702), the tantalum layer (406a), is oxidized as illustrated by the presence of a tantalum pentoxide layer (502a).

The capacitor structure also includes a conducting layer deposited on the barrier layer (702). The conducting layer can be embodied, for example, as a tantalum layer (406b) with a conducting material (602), such as copper, tungsten, aluminum, cobalt, or other appropriate conducting metal deposited on the tantalum layer (406b). Readers will appreciate that by virtue of the capacitor structure containing a conductor (unoxidized portion of the barrier layer), a dielectric (oxidized portion of the barrier layer), and then a conductor (tantalum layer with conducting material deposited thereon), a capacitor may be formed.

It will be understood from the foregoing description that modifications and changes may be made in various embodiments without departing from its true spirit. The descriptions in this specification are for purposes of illustration only and are not to be construed in a limiting sense. The scope of the present disclosure is limited only by the language of the following claims.

What is claimed is:

1. A semiconductor substrate, comprising:
   one or more vias, each of the one or more via including;
   a dielectric layer deposited on the via walls;
   a barrier layer deposited on the dielectric layer, wherein the barrier layer includes a tantalum nitride layer and an oxidized tantalum layer deposited on the tantalum nitride layer, and wherein an interface between the barrier layer and the dielectric layer is not oxidized; and
   a conducting layer deposited on the barrier layer.

2. The semiconductor substrate of claim 1 wherein the dielectric layer comprises a chemical vapor deposition ('CVD') oxide film.

3. The semiconductor substrate of claim 1 wherein the dielectric layer comprises a chemical vapor deposition ('CVD') nitride film.

4. The semiconductor substrate of claim 1 wherein the dielectric layer comprises a physical vapor deposition ('PVD') dielectric film.

5. The semiconductor substrate of claim 1 wherein the conducting layer is comprised of copper.

6. The semiconductor substrate of claim 1 wherein the dielectric layer is comprised of a chemical vapor deposition ('CVD') nitride film.

7. The semiconductor substrate of claim 1 wherein the semiconductor substrate is a silicon wafer and the via is a through-silicon via ('TSV').

8. A semiconductor substrate, comprising:
- a dielectric layer deposited on the semiconductor substrate; and
- a capacitor structure, including:
  - a barrier layer deposited on the dielectric layer, wherein the barrier layer includes a tantalum nitride layer and an oxidized tantalum layer deposited on the tantalum nitride layer, and wherein an interface between the barrier layer and the dielectric layer is not oxidized; and
  - a conducting layer deposited on the barrier layer.

9. The semiconductor substrate of claim 8 wherein the conducting layer includes a tantalum layer and a conducting metal deposited on the barrier layer.

10. The semiconductor substrate of claim 9 wherein the conducting metal is copper.

\* \* \* \* \*